United States Patent
Chen et al.

(10) Patent No.: US 8,860,151 B2
(45) Date of Patent: Oct. 14, 2014

(54) SEMICONDUCTOR DEVICE HAVING A SPACER AND A LINER OVERLYING A SIDEWALL OF A GATE STRUCTURE AND METHOD OF FORMING THE SAME

(71) Applicant: Taiwan Semiconductor Manufacturing Company, Ltd., Hsin-Chu (TW)

(72) Inventors: Sheng-Ching Chen, Hsin-Chu (TW);
Kuang-Hsin Chen, Jung-Li (TW);
Bor-Zen Tien, Hsin-Chu (TW);
Tzong-Sheng Chang, Chubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/782,072

(22) Filed: Mar. 1, 2013

(65) Prior Publication Data

US 2014/0246709 A1    Sep. 4, 2014

(51) Int. Cl.
*H01L 21/02* (2006.01)
*H01L 29/78* (2006.01)
*H01L 21/76* (2006.01)

(52) U.S. Cl.
CPC ............. *H01L 29/78* (2013.01); *H01L 21/76* (2013.01)
USPC ........................ 257/411; 257/288; 438/424

(58) Field of Classification Search
CPC ............... H01L 29/42336; H01L 27/10876; H01L 29/6656; H01L 29/0603; H01L 27/115; H01L 27/1152
USPC ....................................................... 257/330
See application file for complete search history.

(56) References Cited

U.S. PATENT DOCUMENTS

| | | | | |
|---|---|---|---|---|
| 6,140,688 A | * | 10/2000 | Gardner et al. | 257/412 |
| 2005/0139900 A1 | * | 6/2005 | Jung et al. | 257/319 |
| 2005/0167741 A1 | * | 8/2005 | Divakaruni et al. | 257/328 |
| 2007/0096185 A1 | * | 5/2007 | Kim et al. | 257/301 |

* cited by examiner

Primary Examiner — Eva Yan Montalvo
(74) Attorney, Agent, or Firm — Slater and Matsil, L.L.P.

(57) ABSTRACT

A semiconductor device includes a gate structure over a substrate. The device further includes an isolation feature in the substrate and adjacent to an edge of the gate structure. The device also includes a spacer overlying a sidewall of the gate structure. The spacer has a bottom lower than a top surface of the substrate.

20 Claims, 10 Drawing Sheets

US 8,860,151 B2

SEMICONDUCTOR DEVICE HAVING A SPACER AND A LINER OVERLYING A SIDEWALL OF A GATE STRUCTURE AND METHOD OF FORMING THE SAME

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as a metal-oxide-semiconductor field-effect transistors (MOSFETs), are scaled down through various technology nodes, strained source/drain features (e.g., stressor regions) have been implemented to enhance carrier mobility and improve device performance. Although existing approaches to forming stressor regions for IC devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
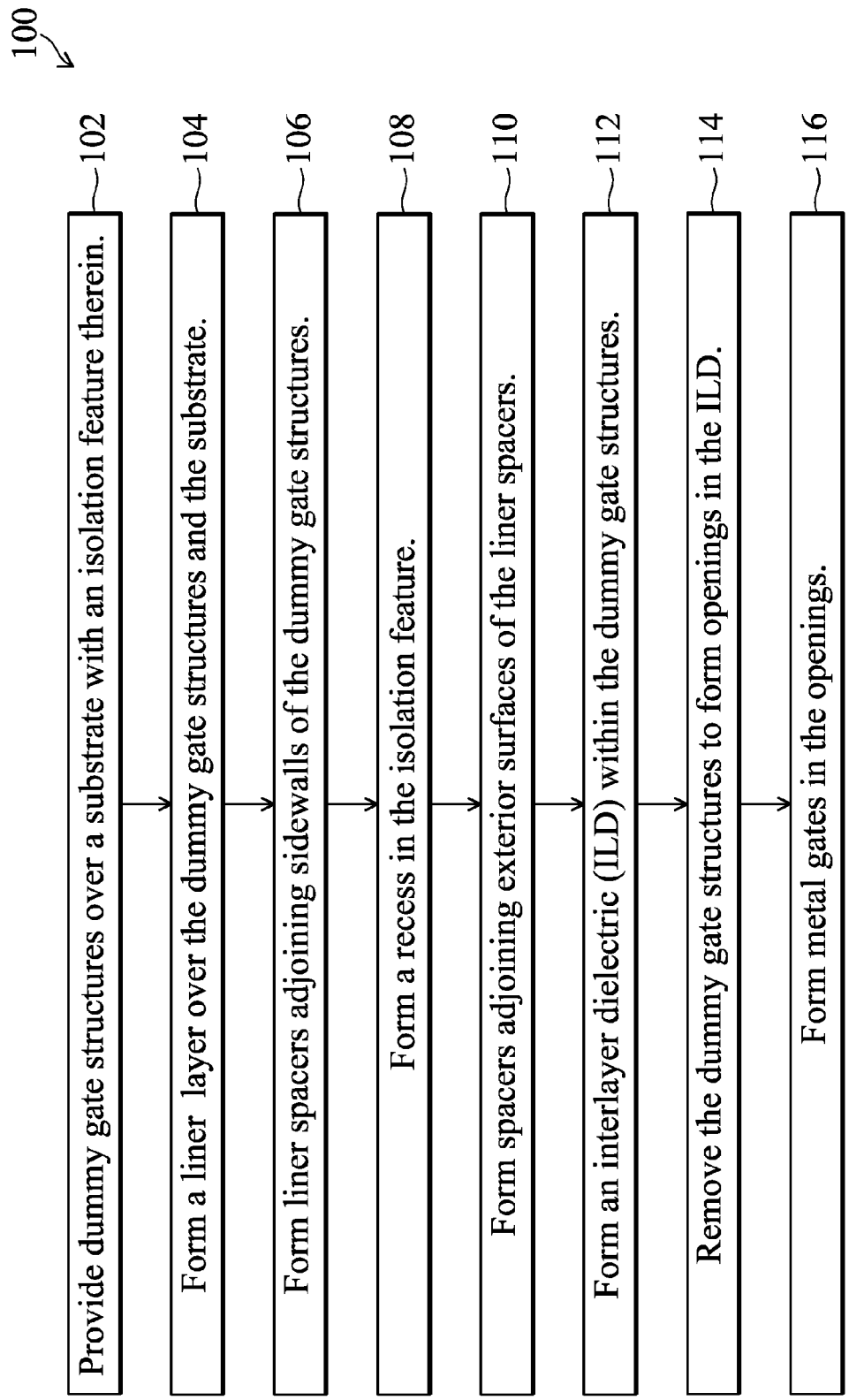
FIG. 1 is a flowchart illustrating a method of forming a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

Examples of devices that can benefit from one or more embodiments of the present invention are semiconductor devices with field effect transistors (FET). Such a device, for example, is a complementary metal-oxide-semiconductor (CMOS) field effect transistor. The following disclosure will continue with this example to illustrate various embodiments of the present application. It is understood, however, that the present application should not be limited to a particular type of device, except as specifically claimed.

With reference to FIGS. 1, 2A, 2B, and 3-9, a method 100 and a semiconductor device 200 are collectively described below. The semiconductor device 200 refers to an integrated circuit, or a portion thereof, that can comprise active devices such as metal-oxide-semiconductor field effect transistors (MOSFETs), complementary metal-oxide-semiconductor (CMOS) transistors, high voltage transistors, and/or high frequency transistors; other suitable components; and/or combinations thereof. The semiconductor device 200 may additionally include passive components, such as resistors, capacitors, inductors, and/or fuses. It is understood that the semiconductor device 200 may be formed by CMOS technology processing, and thus some processes are not described in detail herein. Additional steps can be provided before, during, or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Referring to FIG. 1, a method 100 for fabricating a semiconductor device is described according to various aspects of the present disclosure. The method 100 begins with step 102 in which dummy gate structures are formed over a substrate with an isolation feature therein. The method 100 continues with step 104 in which a liner layer is formed over the dummy gate structures. The method 100 continues at step 106 in which liner spacers are formed adjoining sidewalls of the dummy gate structures. The method 100 continues at step 108 in which a recess is formed in the isolation feature. The method 100 continues at step 110 in which spacers are formed adjoining exterior surfaces of the liner spacers. The method 100 continues at step 112 in which an interlayer dielectric (ILD) is formed within the dummy gate structures. The method 100 continues at step 114 in which the dummy gate structures are removed to form openings in the ILD. The method 100 continues at step 116 in which metal gates are formed in the openings. The discussion that follows illustrates various embodiments of a semiconductor device 200 that can be fabricated according to the method 100 of FIG. 1.

Figure 2A:
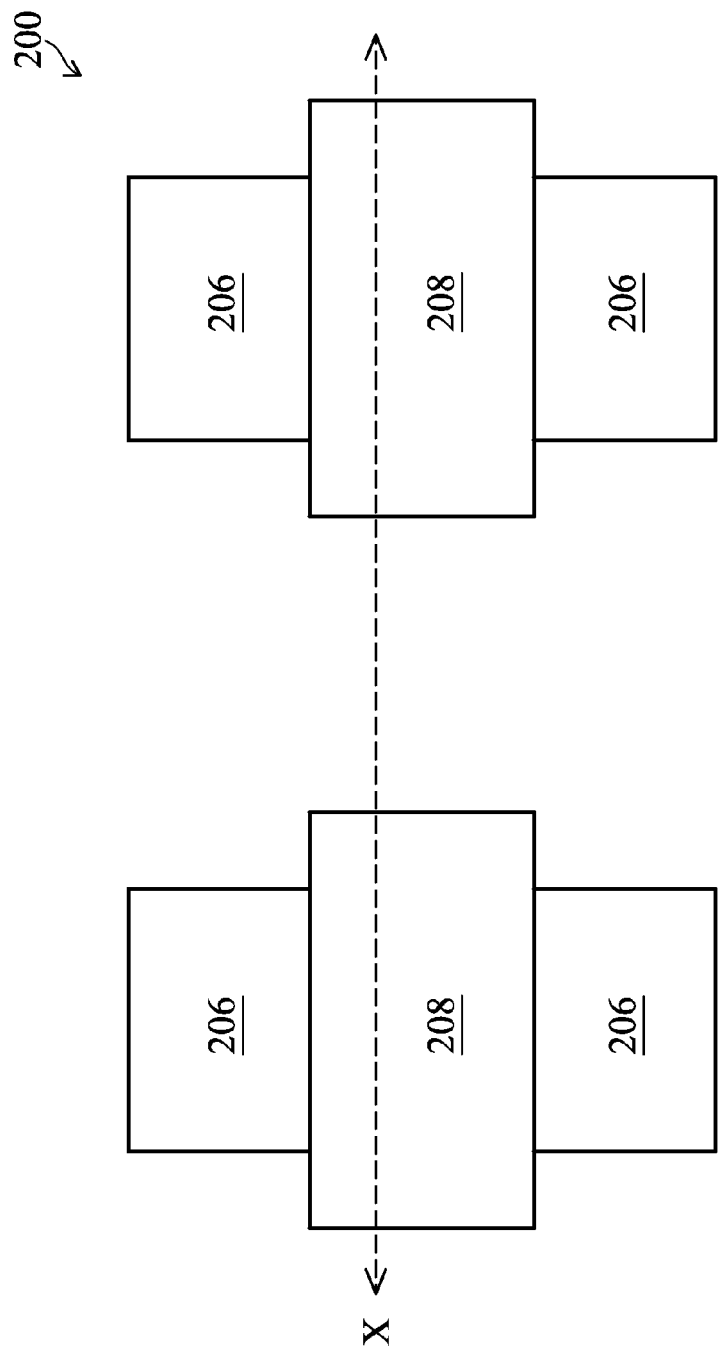
FIG. 2A is a top view of a semiconductor device at the first stage of fabrication according to the method of FIG. 1 in accordance with one or more embodiments.
Figure 2B:
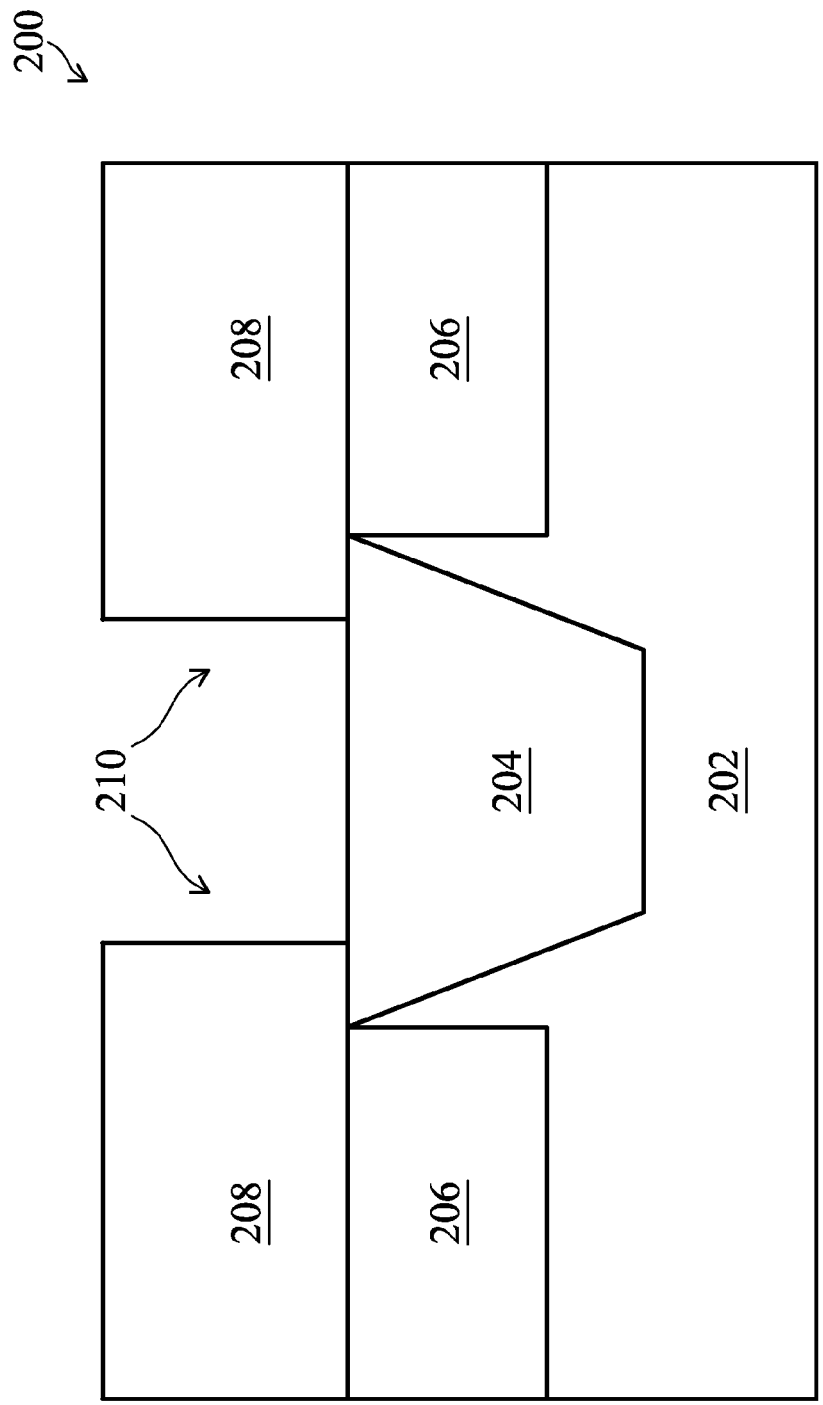
FIGS. 2B, 3 to 9 are cross-sectional side views of a semiconductor device at various stages of fabrication according to the method of FIG. 1 in accordance with one or more embodiments.

FIG. 2A is a top view of the semiconductor device 200 at the first various stage of fabrication according to the method 100 of FIG. 1. FIGS. 2B, 3 to 9 are cross-sectional side views of the semiconductor device 200 at various stages of fabrication according to the method 100 of FIG. 1. Referring to FIGS. 12A, and 2B, the method 100 begins at step 102, wherein dummy gate structures 208 are formed over a substrate 202. In some embodiments, each of the dummy gate structures 208 defines an active area 206 of the substrate 202 thereunder. FIG. 2A illustrates a top view of the dummy gate structures 208 over the active areas 206. FIG. 2B illustrates a cross-sectional view of the structure along the x-axis of FIG. 2A. An isolation feature 204 is included in the substrate 202.

In some embodiments, the isolation feature 204 is positioned between the dummy gate structures.

In the present embodiment, the substrate 202 is a semiconductor substrate including silicon. In alternative embodiments, the substrate 202 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Where the substrate 202 is an alloy semiconductor, the alloy semiconductor substrate could have a gradient SiGe feature in which the Si and Ge composition change from one ratio at one location to another ratio at another location of the gradient SiGe feature. The alloy SiGe could be formed over a silicon substrate, and/or the SiGe substrate may be strained. In yet another alternative embodiment, the semiconductor substrate could be a semiconductor on insulator (SOI).

The substrate 202 includes various doped regions depending on design requirements as known in the art (e.g., p-type wells or n-type wells). The doped regions are doped with p-type dopants, such as boron or $BF_2$, and/or n-type dopants, such as phosphorus or arsenic. The doped regions may be formed directly on the substrate 202, in a P-well structure, in an N-well structure, in a dual-well structure, or using a raised structure. In some embodiments, the isolation features 204 included in the substrate 202 is used to define and isolate various active regions of the substrate 202. The isolation features 204 utilize isolation technology, such as shallow trench isolation (STI) or local oxidation of silicon (LOCOS), to define and electrically isolate the various regions. The isolation features 204 include silicon oxide, silicon nitride, silicon oxynitride, other suitable materials, or combinations thereof.

Still referring to FIG. 2, in some embodiments, the dummy gate structures 208 are formed by sequentially depositing and patterning a gate dielectric layer, a gate electrode layer, and a hard mask layer on the substrate 202. The gate dielectric layer, in one example, is a thin film comprising silicon oxide, silicon nitride, silicon oxynitride, high-k dielectrics, other suitable dielectric materials, or combinations thereof. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer is a high-k dielectric layer with a thickness in the range of about 10 angstroms to about 30 angstroms. The gate dielectric layer may be formed using a suitable process such as atomic layer deposition (ALD), chemical vapor deposition (CVD), physical vapor deposition (PVD), thermal oxidation, UV-ozone oxidation, or combinations thereof. The gate dielectric layer may further comprise an interfacial layer (not shown) to reduce damage between the gate dielectric layer and the substrate 202. The interfacial layer may comprise silicon oxide.

The gate electrode layer is then formed on the gate dielectric layer. In some embodiments, the gate electrode layer includes a single layer or multilayer structure. In the present embodiment, the gate electrode layer comprises polysilicon. Further, the gate electrode layer may be doped polysilicon with the same or different doping species. In one embodiment, the gate electrode layer has a thickness in the range of about 30 nm to about 60 nm. The gate electrode layer may be formed using a process such as low-pressure chemical vapor deposition (LPCVD), plasma enhanced chemical vapor deposition (PECVD), other suitable processes, or combinations thereof. Next, the hard mask layer is formed over the gate electrode layer and a patterned photo-sensitive layer (not shown) is formed on the hard mask layer. The pattern of the photo-sensitive layer is transferred to the hard mask layer and then transferred to the gate electrode layer and the gate dielectric layer to form the dummy gate structures 208. In some embodiments, the hard mask layer includes silicon oxide. In alternative embodiments, the hard mask layer includes silicon nitride, silicon oxynitride, and/or other suitable dielectric materials, and may be formed using a method such as CVD or PVD. The hard mask layer has a thickness in the range from about 100 angstroms to about 800 angstroms. The photo-sensitive layer is removed thereafter by a dry and/or wet stripping process.

Figure 3:
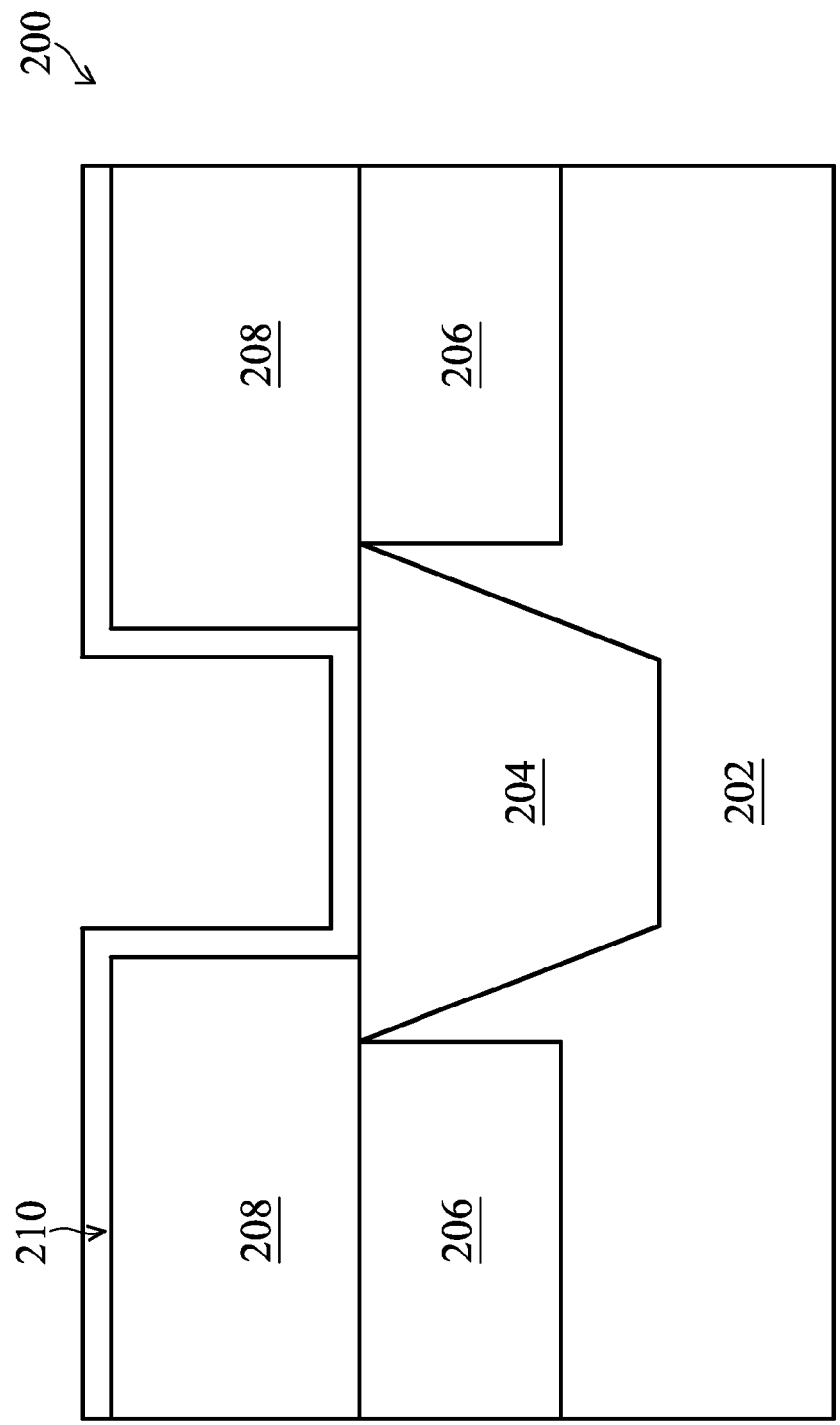

Referring to FIGS. 1 and 3, the method 100 proceeds to step 104, wherein a liner layer 210 is formed over the dummy gate structures 208 and the substrate 202. In some embodiments, the liner layer 210 is blanket deposited silicon oxide, oxynitride, silicon nitride, silicon boron nitride, or boron nitride. In some embodiments, the liner layer 210 has a thickness ranging from about 10 Angstroms to about 100 Angstroms. In one embodiment, the liner layer 210 is formed by using commonly used techniques, such as PECVD, LPCVD, sub-atmospheric chemical vapor deposition (SACVD), atomic layer deposition (ALD), and the like.

Figure 4:
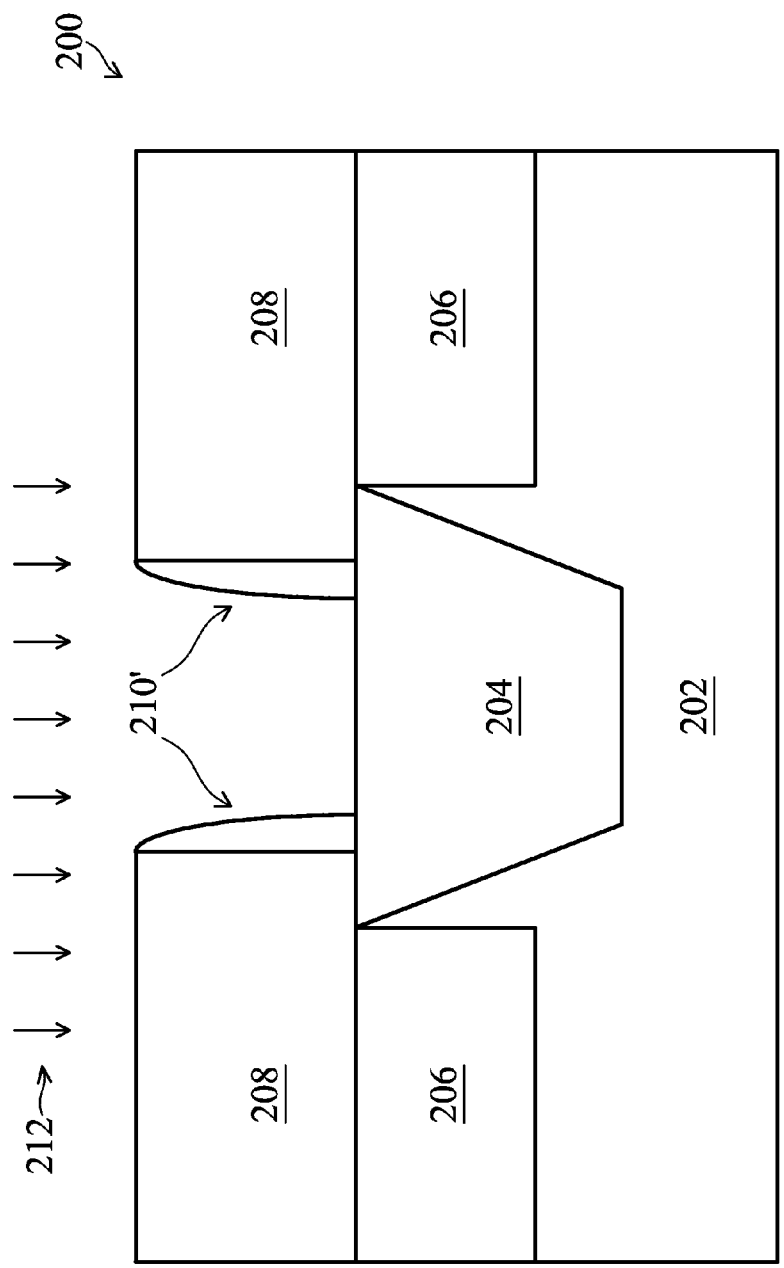

Referring to FIGS. 1 and 4, the method 100 proceeds to step 106, wherein liner spacers 210' are formed adjoining sidewalls of the dummy gate structures 208. In one embodiment, the liner spacers 210' are formed by performing a first etching process 212 to remove portions of the liner layer 210 over the top surface of the dummy gate structures 208 and the substrate 202. The first etching process 212 may be performed by either a wet etching process, a dry etching process, or combinations thereof. Preferably, the liner layer 210 is patterned by a dry etching process. More preferably, the liner layer 210 is patterned by an anisotropic dry etching process. The first etching process 212, for example, is a blanket dry etching process using a pre-determined recipe by a plasma etcher.

Figure 5:
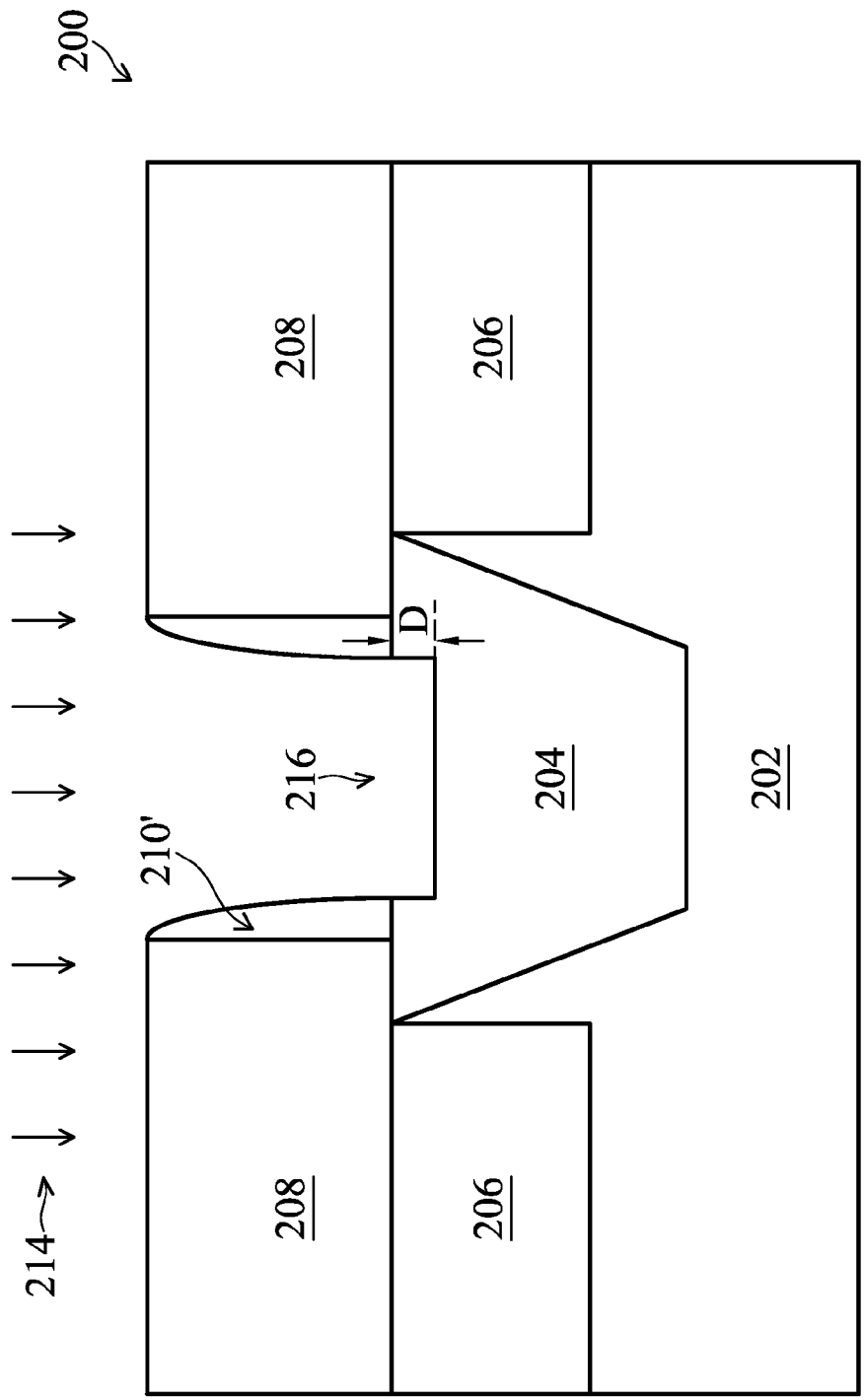
Figure 6:
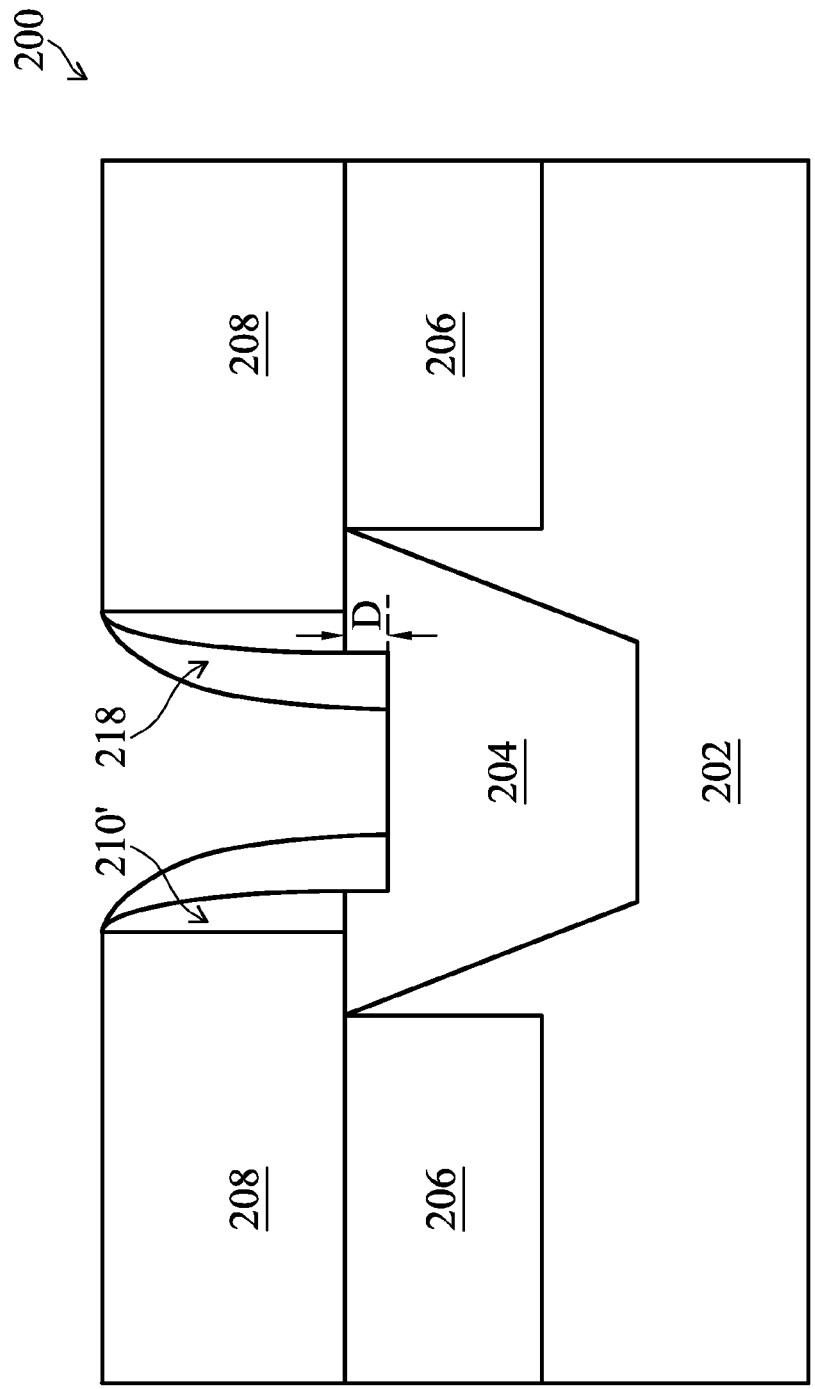

Referring to FIGS. 1 and 5, the method 100 proceeds to step 108, wherein a recess 216 is formed in the isolation features 204. In some embodiments, the recess 216 is formed by performing a second etching process 214. The second etching process 214 blanket removes an upper portion of the isolation features 204 uncovered by the liner spacers 210' or the dummy gate structures 208. In some embodiments, the recess 216 has an etched depth D ranging between from about 1 nanometer to about 20 nanometers. The second etching process 214 may be performed by either wet etching process, dry etching process, or a combination thereof. Preferably, the recess 216 is formed by a dry etching process. More preferably, the recess 216 is patterned by a dry chemical etching process. The second etching process 214, for example, is a blanket dry chemical etching process using a pre-determined recipe by a non-plasma etcher. In some embodiments, the second etching process 214 is performed using the etching recipe different from the etching recipe of the first etching process 212. In the present embodiment, the second etching process 214 is a two-step process. The two-step process, for example, includes etching the upper portion of the isolation features 204 by using HF, and then removing the etching by-products by using $NH_3$. In the present embodiment, the second etching process 214 is performed under a pressure ranging between about 10 mTorr and about 50 mTorr. Referring to FIGS. 1 and 6, the method 100 proceeds to step 110, wherein spacers 218 are formed adjoining exterior surfaces of the liner spacers 210'. In some embodiments, the formation process of the spacers 218 are started by blank depositing a spacer layer over the liner spacers 210', the dummy gate structures 208, and the substrate 202. The spacer layer, for example, is a dielectric layer with a material of silicon oxide, oxynitride, silicon nitride, silicon boron nitride, or boron nitride. In some embodiments, the spacer layer includes a material different from the material of the liner layer 210. In alternative embodiments, the spacer layer includes a material the same as the material of the liner layer 210. In the present embodiment, the liner layer 210 is silicon oxide and the spacer layer is silicon nitride. The spacer layer, in one embodiment, has a thickness ranging from about 100 Angstroms to about 400 Angstroms, and preferably ranged from about 150 Angstroms to about 300 Angstroms. In some embodiments, the spacer layer is formed by using commonly used techniques, such as PECVD, LPCVD, SACVD, ALD, and the like.

An etching process is applied to remove portions of the spacer layer over the top surface of the dummy gate structures 208 and the substrate 202, while leaving portions of the spacer layer adjoining sidewalls of the liner spacers 210' to form the spacers 218. In some embodiments, the bottom portions of the spacers 218 are located within the recess 216. In some embodiments, the bottom surface of the spacers 218 is lower than the bottom surface of the liner spacers 210'. A height difference between the bottom surface of the spacers 218 and the bottom surface of the liner spacers 210' is about the depth D of the recess 216.

Figure 7:
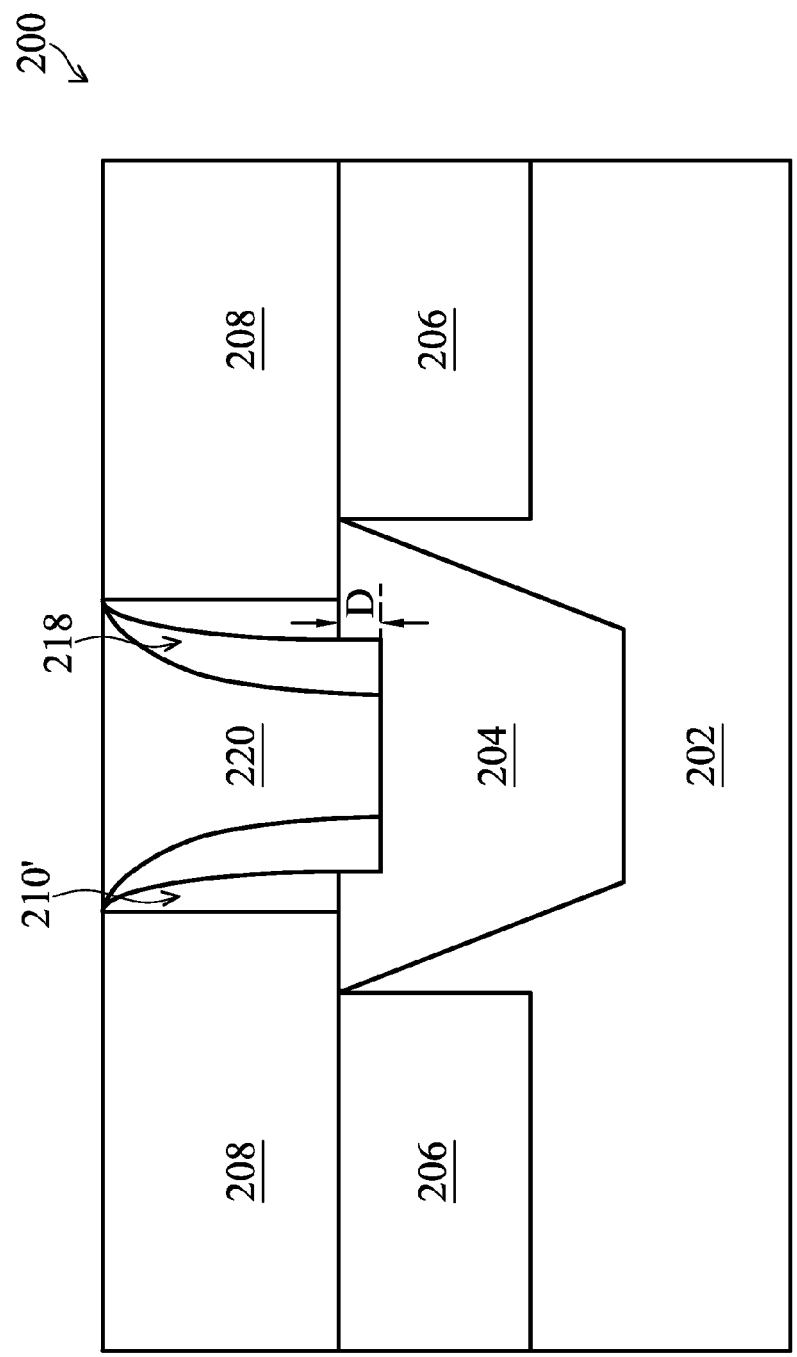

Referring to FIGS. 1 and 7, the method 100 proceeds to step 112, wherein an interlayer dielectric (ILD) 220 is formed within the dummy gate structures 208. In some embodiments, at least one dielectric layer is disposed over the substrate 202 to fill the gap within the dummy gate structures 208. The dielectric layer, for example, includes a material of oxide, nitride, oxynitride, low-k dielectric material, ultra low-k dielectric material, extreme low-k dielectric material, other dielectric material, and/or combinations thereof. In some embodiments, the dielectric layer is formed by CVD process, high density plasma (HDP) CVD process, other deposition process, and/or any combinations thereof. Then, in some embodiments, a removing process is applied to the dielectric layer to remove the portion of the dielectric layer over the top surfaces the dummy gate structures 208. In some embodiments, the removing process results a planarized surface of the ILD 220 with a top surface substantially co-planer with the top surfaces the dummy gate structures 208. In some embodiments, the removing process includes chemical-mechanical polish (CMP) process, dry etch process, wet etch process, and/or combinations thereof.

Figure 8:
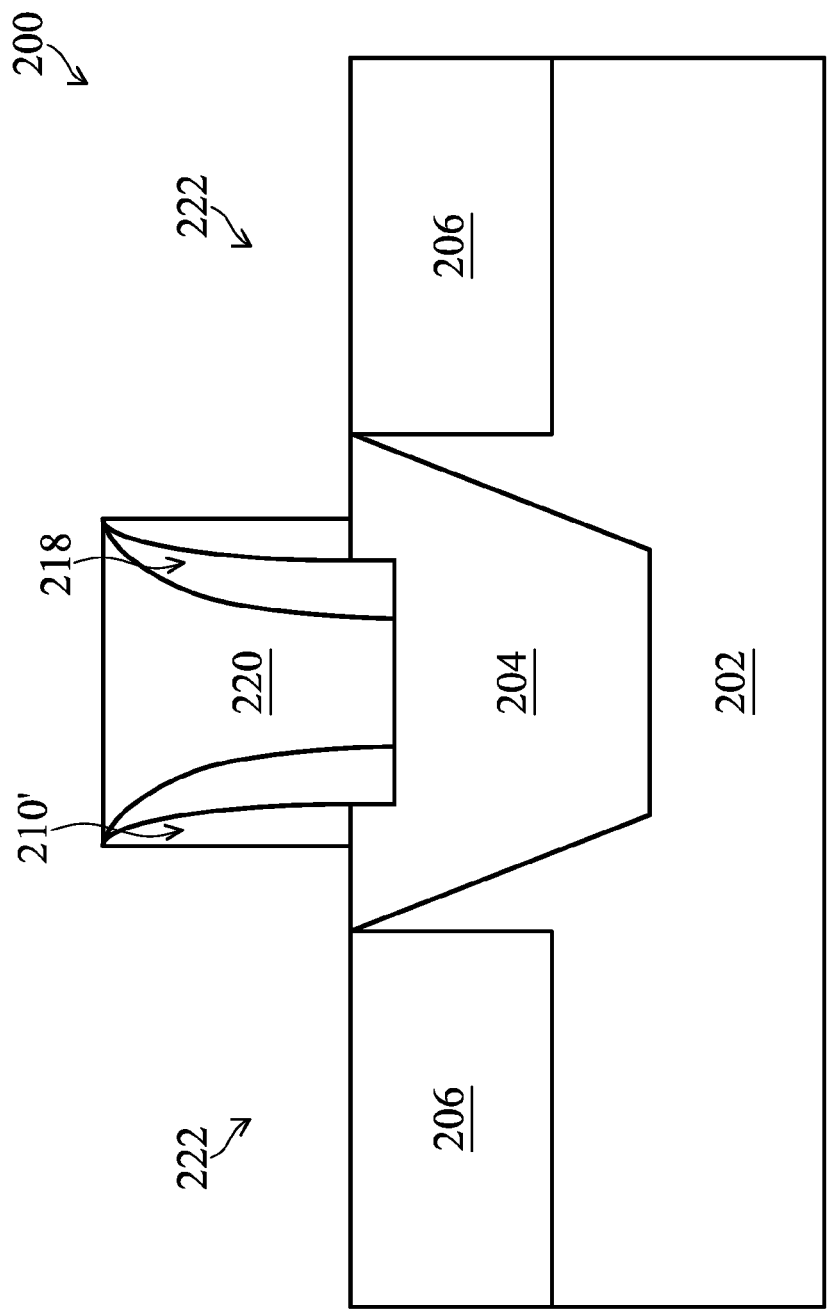

Referring to FIGS. 1 and 8, the method 100 proceeds to step 114, wherein the dummy gate structures 208 are substantially removed to form the openings 222. The dummy gate structures 208 are removed by, for example, a wet etch process, a dry etch process, other removing process, and/or combinations thereof. In some embodiments, the gate electrode layer and the hard mask layer of the dummy gate structures 208 are removed by an etching process. In some embodiments, the gate dielectric of the dummy gate structures 208 includes a high-k dielectric material which is not damaged by the removing process.

Figure 9:
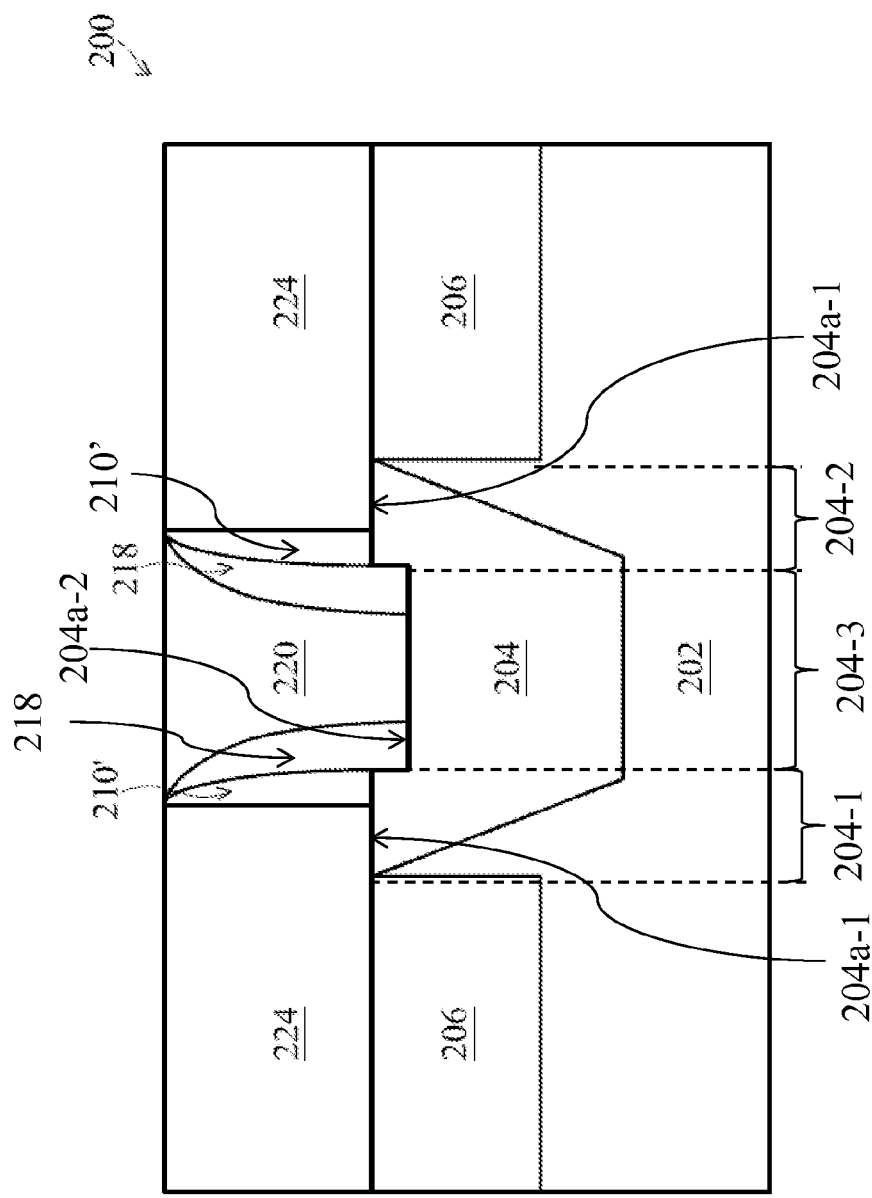

Referring to FIGS. 1 and 9, the method 100 proceeds to step 116, wherein metal gates 224 are formed within the openings 222. In some embodiments, the metal gates 224 include a n-type and/or p-type work function material formed over the active areas 206. In some embodiments, the n-type work function material provides a desired work function value for the gate electrode of the N-type transistor. In some embodiments, the p-type work function material provides a desired work function value for the gate electrode of the P-type transistor. The n-type work and p-type work function materials can be formed by any suitable process, such as ALD, CVD, PVD, remote plasma CVD (RPCVD), PECVD, metal organic CVD (MOCVD), sputtering, plating, other suitable processes, and/or combinations thereof. The liner spacer 210' may be located between the spacer 218 and a sidewall of the metal gate 224 (e.g., as shown in FIG. 9). The isolation feature 204 (e.g. STI) may have a top surface 204a-1, 204a-2. The top surface 204a-1, 204a-2 of the isolation feature 204 (e.g. STI) may have a first top surface 204a-1 and a second top surface 204a-2. The second top surface 204a-2 may be lower than the first top surface 204a-1. A height difference between the first top surface 204a-1 and the second top surface 204a-2 of the isolation feature 204 may range between from about 1 nanometer to about 20 nanometers. The spacer 218 may be above the second top surface 204a-2 of the isolation feature 204. The isolation feature 204 may have a first portion 204-1, a second portion 204-2, and a third portion between the first portion 204-1 and the second portion 204-2. The first portion 204-1 and the second portion 204-2 of the isolation feature 204 may each have a top surface (e.g., the first top surface 204a-1). The third portion 204-3 of the isolation feature 204 may have a top surface (e.g., the second top surface 204a-2), which may be lower than the top surface (e.g. the first top surface 204a-1) of the first portion 204-1 or the second portion 204-2 of the isolation feature 204.

There are some cleaning processes before forming the ILD and after forming the high-K dielectric. The chemicals used for the cleaning processes may attack the high-K dielectric along the interface between the sidewall spacers and the isolation feature (e.g., STI). A benefit of the sidewall spacer with an additional portion below the bottom surface of the gate structure, in accordance with the disclosed embodiments, is that the additional portion of the sidewall spacer may increase the leakage path of chemicals. The additional portion of the sidewall spacer may function as a protector to prevent the high-K dielectric being attacked by chemicals before forming ILD. Thus, the disclosed embodiments provide increased performance and reliability of devices. It is understood that different embodiments may have different advantages, and that no particular advantage is necessarily required of any embodiment.

The semiconductor device may undergo further CMOS or MOS technology processing to form various features. For example, the method 100 may proceed to form main spacers. Contact features, such as silicide regions, may also be formed. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer is able to react with silicon to form silicide, and then removing the non-reacted metal layer. An inter-metal dielectric (IMD) layer can further be formed on the substrate and a chemical mechanical polishing (CMP) process is further applied to the substrate to planarize the substrate. Further, a contact etch stop layer (CESL) may be formed on top of the gate structure before forming the ILD layer.

In an embodiment, the dummy gate structures remain polysilicon in the final device. In another embodiment, a gate replacement process (or gate last process) is performed, where the polysilicon gate stacks are replaced with a metal gate. For example, a metal gate may replace the dummy gate structure (i.e., polysilicon gate stack). The metal gate includes liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may further form various contacts/vias/lines and multilayer interconnect features (e.g., metal layers and interlayer dielectrics) on the substrate, configured to connect the various features or structures of the semiconductor device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The disclosed semiconductor device may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

In one embodiment, a device includes a gate structure over a substrate, an isolation feature in the substrate adjacent to an edge of the gate structure, and a spacer overlying a sidewall of the gate structure, wherein a bottom surface of the spacer is lower than a top surface of the substrate.

In another embodiment, a semiconductor device, includes a first gate structure and a second gate structure over a substrate, an isolation feature in the substrate between the first gate structure and the second gate structure, the isolation feature having a first portion adjacent to the first gate structure, a second portion adjacent to the second gate structure, and a third portion between the first portion and the second portion, wherein the third portion has a top surface lower than a top surface of the first or the second portion, a first liner spacer adjoining a sidewall of the first gate structure and a second liner spacer adjoining a sidewall of the second gate structure, and a first spacer adjoining an exterior surface of the first liner spacer and a second spacer adjoining an exterior surface of the second liner spacer. The first spacer and the second spacer are above the third portion of the isolation feature.

In still another embodiment, a method of manufacturing a semiconductor device, includes forming an isolation feature in a substrate, forming a gate structure adjacent to the isolation feature over the substrate, forming a recess in the isolation feature; and forming a spacer overlying a sidewall of the gate structure. The spacer has a portion in the recess.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a gate structure over a substrate;
   an isolation feature in the substrate adjacent to an edge of the gate structure; and
   a spacer overlying a sidewall of the gate structure and disposed over a top surface of the isolation feature, wherein a bottom surface of the spacer is lower than a bottom surface of the gate structure; and
   a liner spacer located between the spacer and the sidewall of the gate structure, wherein a bottom surface of the liner spacer is co-planar with the bottom surface of the gate structure.

2. The device of claim 1, wherein a height difference between the bottom surface of the spacer and the bottom surface of the gate structure ranges between from about 1 nanometer to about 20 nanometers.

3. The device of claim 1, wherein the top surface of the isolation feature comprises a first top surface and a second top surface, and the second top surface is lower than the first top surface.

4. The device of claim 3, wherein the spacer is above the second top surface of the isolation feature.

5. The device of claim 3, wherein a height difference between the first top surface and the second top surface of the isolation feature ranges between from about 1 nanometer to about 20 nanometers.

6. The device of claim 1, wherein the gate structure comprises a metal gate electrode.

7. The device of claim 1, wherein the spacer comprises a material different from a material of the liner spacer.

8. The device of claim 1, wherein a thickness of the spacer is in a range from about 100 Angstroms to about 400 Angstroms.

9. A semiconductor device, comprising:
   a first gate structure and a second gate structure over a substrate;
   an isolation feature in the substrate between the first gate structure and the second gate structure, the isolation feature having a first portion adjacent to the first gate structure, a second portion adjacent to the second gate structure, and a third portion between the first portion and the second portion, wherein the third portion has a top surface lower than a top surface of the first or the second portion;
   a first liner spacer adjoining a sidewall of the first gate structure and a second liner spacer adjoining a sidewall of the second gate structure; and
   a first spacer adjoining an exterior surface of the first liner spacer and a second spacer adjoining an exterior surface of the second liner spacer, wherein the first spacer and the second spacer are above the third portion of the isolation feature, and wherein the first liner spacer and the second liner spacer have a bottom surface substantially co-planer with a bottom surface of the first gate structure and the second gate structure, respectively.

10. The device of claim 9, further comprising:
an interlayer dielectric (ILD) between the first spacer and the second spacer.

11. The device of claim 10, wherein the ILD is above the third portion of the isolation feature.

12. The device of claim 10, wherein the ILD has a bottom surface lower than a bottom surface of the first liner spacer.

13. The device of claim 9, wherein the first liner spacer and the second liner spacer are above the first portion of the isolation feature and the second portion of the isolation feature, respectively.

14. The device of claim 9, wherein a height difference between the top surface of the third portion and the top surface of the first portion or the second portion of the isolation feature ranges between from about 1 nanometer to about 20 nanometers.

15. The device of claim 9, wherein the first spacer has a bottom surface lower than a bottom surface of the first liner spacer.

16. The device of claim 9, wherein each of the first gate structure and the second gate structure comprises a metal gate electrode.

17. The device of claim 9, wherein a thickness of the first spacer and a thickness of the second spacer are in a range from about 100 Angstroms to about 400 Angstroms.

18. A method of manufacturing a semiconductor device, comprising:
forming an isolation feature in a substrate;
forming a gate structure adjacent to the isolation feature over the substrate;
forming a recess in the isolation feature;
forming a liner layer over the gate structure and the substrate;
patterning the liner layer to form a liner spacer overlying a sidewall of the gate structure, wherein a bottom surface of the liner layer is co-planar with a bottom surface of the gate structure; and
forming a spacer overlying the liner spacer and over a top surface of the isolation feature, wherein the spacer has a portion in the recess, and wherein a bottom surface of the spacer is lower than the bottom surface of the gate-structure.

19. The method of claim 18, wherein the recess is formed after forming the liner spacer.

20. The method of claim 18, furthering comprising:
forming an ILD in the recess.

* * * * *